United States Patent [19]

Ikeda

[11] Patent Number: 5,008,858
[45] Date of Patent: Apr. 16, 1991

[54] ASYNCHRONOUS SEMICONDUCTOR MEMORY HAVING ADDRESS TRANSITION DETECTOR

[75] Inventor: Setsuko Ikeda, Tokyo, Japan

[73] Assignee: NEC Corporation, Japan

[21] Appl. No.: 398,235

[22] Filed: Aug. 24, 1989

[30] Foreign Application Priority Data

Aug. 25, 1988 [JP] Japan .................................. 63-212227

[51] Int. Cl.$^5$ ............................................... G11C 7/00
[52] U.S. Cl. .................................. 365/233.5; 365/194
[58] Field of Search ............................. 365/233.5, 194

[56] References Cited

U.S. PATENT DOCUMENTS

| 4,701,889 | 10/1987 | Ando | 365/233.5 |
| 4,747,082 | 5/1988 | Minato et al. | 365/233.5 |
| 4,809,233 | 2/1989 | Takemae | 365/230.5 X |
| 4,843,596 | 6/1989 | Miyatake et al. | 365/233.5 |
| 4,872,143 | 10/1989 | Sumi | 365/233.5 |
| 4,893,282 | 1/1990 | Wada et al. | 365/233.5 |
| 4,953,130 | 8/1990 | Houston | 365/194 |

Primary Examiner—Terrell W. Fears
Assistant Examiner—Michael A. Whitfield
Attorney, Agent, or Firm—Laff, Whitesel, Conte & Saret

[57] ABSTRACT

An asynchronous semiconductor memory operates to detect transition of address to thereby generate a clock. A skew time period can be varied from the transition of an address signal to the generation of an internal clock.

4 Claims, 3 Drawing Sheets

ASYNCHRONOUS SEMICONDUCTOR MEMORY HAVING ADDRESS TRANSITION DETECTOR

BACKGROUND OF THE INVENTION

The present invention relates to asynchronous semiconductor memory, and more specifically relates to particular asynchronous semiconductor memory of the type designed according to standard cell system.

FIG. 1 shows a circuit diagram of the ideal asynchronous semiconductor memory devised by this inventor. The asynchronous semiconductor memory does not utilize an external clock signal but generates a clock signal internally. When a signal is transited at an address input terminal 1, that signal is inputted into an input D of a latch circuit 9 and into exclusive-OR gate (EX-OR 3) in the asynchronous semiconductor memory. At this time, since a clock input $\overline{CK}$ of the latch circuit 9 is a High level, the latch circuit 9 is in data-through state. Therefore, an address signal inputted into the latch circuit 9 is transmitted through its output Q to a delay circuit 2. Since inputs of the EX-OR 3 are from the address input terminal 1 and from the delay circuit 2, an output of the EX-OR 3 which detects transition between an old address signal and a new address signal has High level. The delay circuit 2 sets a delay time of reading and writing of RAM cell data. When a signal delayed by the delay time is inputted into the EX-OR 3, since input data coincide with each other, the output of the EX-OR 3 becomes Low level. When a gate of Nchannel (Nch)-transistor 4 becomes High level, the Nchannel (Nch)-transistor 4 turns ON and drain voltage of the Nch-transistor 4 is changed from High level to Low level to generate an internal clock at a node $N_1$. The internal clock is input to a clock signal input in the latch circuit 9. When the internal clock is at Low, the address signal is latched. Until the internal clock turns to High, the address signal inputted from the address input terminal 1 is blocked.

A time interval from change of a given address signal to generation of the internal clock (Low level) corresponds to a time interval during which another address signal can be read (skew). In the prior art, this skew time interval is fixed according to a delay amount of the circuit. There has been proposed no skew control circuit effective to vary the skew time interval according to timing of peripheral system.

In an address detecting circuit of the conventional asynchronous semiconductor memory as described above, since the skew time interval is fixed from the transition of address signal for selecting a desired word line in order to select a particular RAM cell until the generation of internal clock, the conventional memory has drawback that it is necessary to set timing of peripheral system within the skew time interval of the asynchronous semiconductor memory.

SUMMARY OF THE INVENTION

An object of the present invention is to, therefore, provide a skew control circuit in the asynchronous semiconductor memory.

According to the present invention, in the asynchronous semiconductor memory circuit having a plurality of address transition detecting circuits, each of the address transition detecting circuits being receptive of an address signal for generating an address transition signal of constant time interval, a EX-OR gate receiving the outputs of the address transition detecting circuits, a word line selecting section including a latch circuit receiving the output of the EX-OR gate as its clock signal input, a latch driver, a decoder, and a memory portion including a memory cell array connected to a word line, a column selector and a reading-out and writing-in circuit, the asynchronous semiconductor memory circuit is provided with a delay circuit having an input terminal coupled to the output terminal of the EX-OR gate and an output terminal generating a delay signal for enabling the decoder, a delay time of the delay circuit being programmable to a desired value.

DETAILED DESCRIPTION OF EMBODIMENTS

Figure 1:
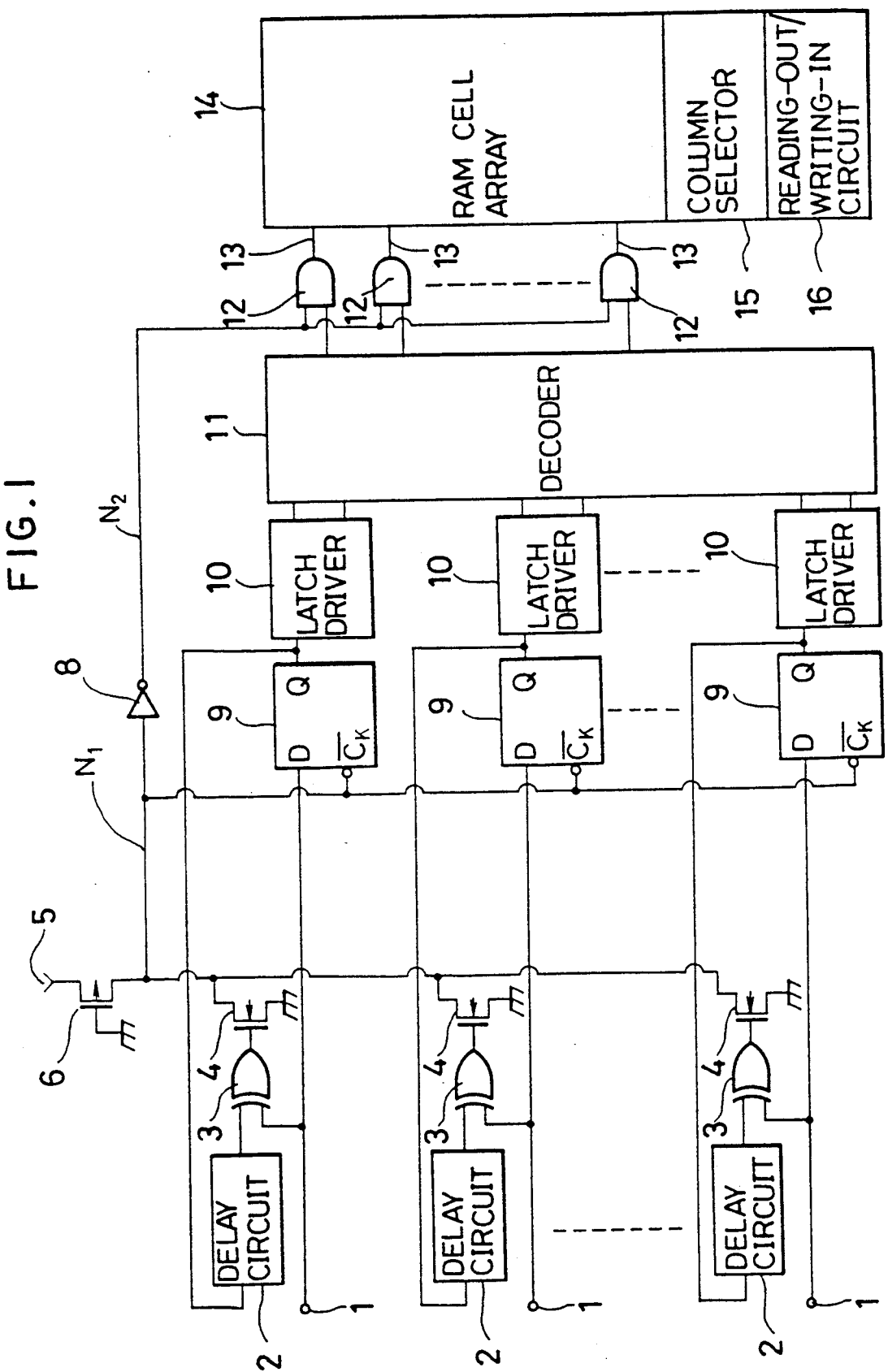
FIG. 1 is a circuit diagram showing the ideal asynchronous memory by this inventor.
Figure 2:
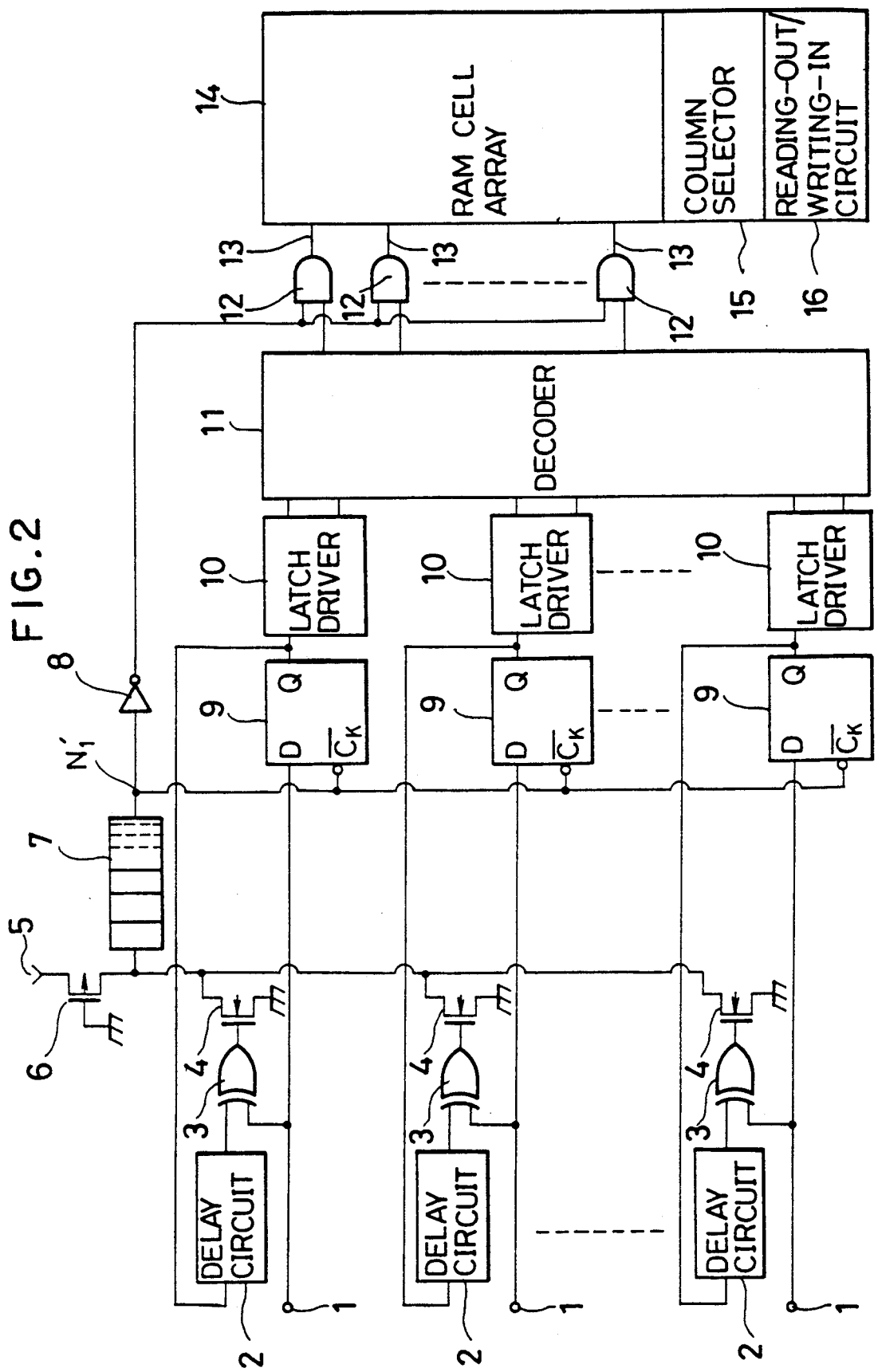
FIG. 2 is a circuit diagram showing a first embodiment of asynchronous semiconductor memory according to the present invention.

The present invention will be described in conjunction with the drawings. FIG. 2 is a circuit block diagram of a first embodiment according to the present invention. In the figure, numeral 1 denotes an address input terminal or reading-out/writing-in control signal terminal. Numeral 2 denotes a delay circuit composed mainly of an inverter and having an input connected to an output of a latch circuit 9, in which a delay time is set for reading-out or writing-in time. Numeral 3 denotes an EX-OR circuit having one input connected to the terminal 1 of the figure and another input connected to an output of the delay circuit 2, and the EX-OR circuit 3 turns its output to Low level when the two inputs are not coincident and to High level when the two inputs are coincident. Numeral 4 denotes each Nch-transistor having respective gate connected to the output of the EX-OR 3. The plurality of Nch-transistors 4 are connected to each other at their drains which are further connected to a Pch-transistor. Numeral 5 denotes a power source terminal. Numeral 6 denotes the Pch-transistor having a gate connected to the ground and a drain which is connected to the drain of each Nch-transistor 4 as described above thereby to form a NOR gate and further connected to an input of a delay circuit 7. Delay circuit elements having delay amounts corresponding to desired clock widths are series-connected to constitute a multi-stage delay circuit 7. An output $N_1'$ of the delay circuit 7 is connected to an inverter 8 and to the latch circuit 9. Numeral 8 denotes the inverter for inverting a pulse generated from the Nch-transistor 4. Further, an output of the inverter 8 is connected to one input of an AND gate 12. Numeral 9 denotes the latch circuit having one input connected to the terminal 1 of the figure and another input connected to the output of the delay circuit 7. Numeral 10 denotes a latch driver connected to an output of the latch circuit 9 for dividing the output thereof into true data and complementary data. Numeral 11 denotes a decoder connected to an output of the latch driver 10.

The AND gate 12 is a gate connecting the output of the inverter 8 and the output of the decoder 11 to each other. This AND gate 12 operates when the output of the inverter 8 is at High level, i.e., when a pulse is generated from the drain terminal of the Nch-transistor 4 to pass through the output data from the decoder 11 as it is. Numeral 13 denotes an output of the AND gate 12 or word line connected to a RAM cell array 14 such that this word line is selected or not selected in response to reading-out and writing-in. When an address signal, which is transited relative to an old address signal, is inputted to the address input terminal 1, the two inputs of the EX-OR 3 do not coincide with each other during the delay amount interval set by the delay circuit 2. Consequently, the output of the EX-OR 3 is turned to High level effective to turn on the Nch-transistor 4.

Electric charge stored in a diffusion capacitance of the Nch-transistor 4 and in a capacitance of a lead pattern connected thereto is discharged through the Nch-transistor 4.

The input of the delay circuit 7 is changed to Low level to thereby effect reading-out and writing-in. When the two inputs of the EX-OR 3 coincide to each other, the output becomes Low level so that the Nch-transistor 4 is turned off and the Pch-transistor 6 operates to charge the diffusion capacitance and the lead pattern capacitance of the Nch-transistor 4 to thereby return the input of the delay circuit 7 to High level.

Since the latch circuit 9 receives the signal input, the latch circuit 9 is in data latch state when the internally generated clock is at Low level so that the address data at the address input terminal 1 cannot pass through the latch circuit 9. Further, when the internally generated clock is at High level, since the latch circuit 9 is in data-through state, the address data at the address input terminal 1 passes through the latch circuit 9 as it is.

In order to adjust to a desired skew time interval in matching to operating timing of peripheral system, a change interval is regulated, during which the clock inverting signal input of the latch circuit 9 is changed from High level to Low level. Namely, the internal clock generated from the drain terminals of the Nch-transistor 4 and Pch-transistor 6 is regulated or controlled. Each of the delay circuit elements series-connected in the delay circuit 7 connected at its input to the drain terminals of the Nch-transistors 4 and Pch-transistor 6 has a constant delay amount such that the total delay amount of the delay circuit 7 is set different according to the number of elements. In order to adjust to the skew time interval matched to the timing of the peripheral system, a desired number of the delay circuit elements are series-connected to set the needed delay amount.

Figure 3:
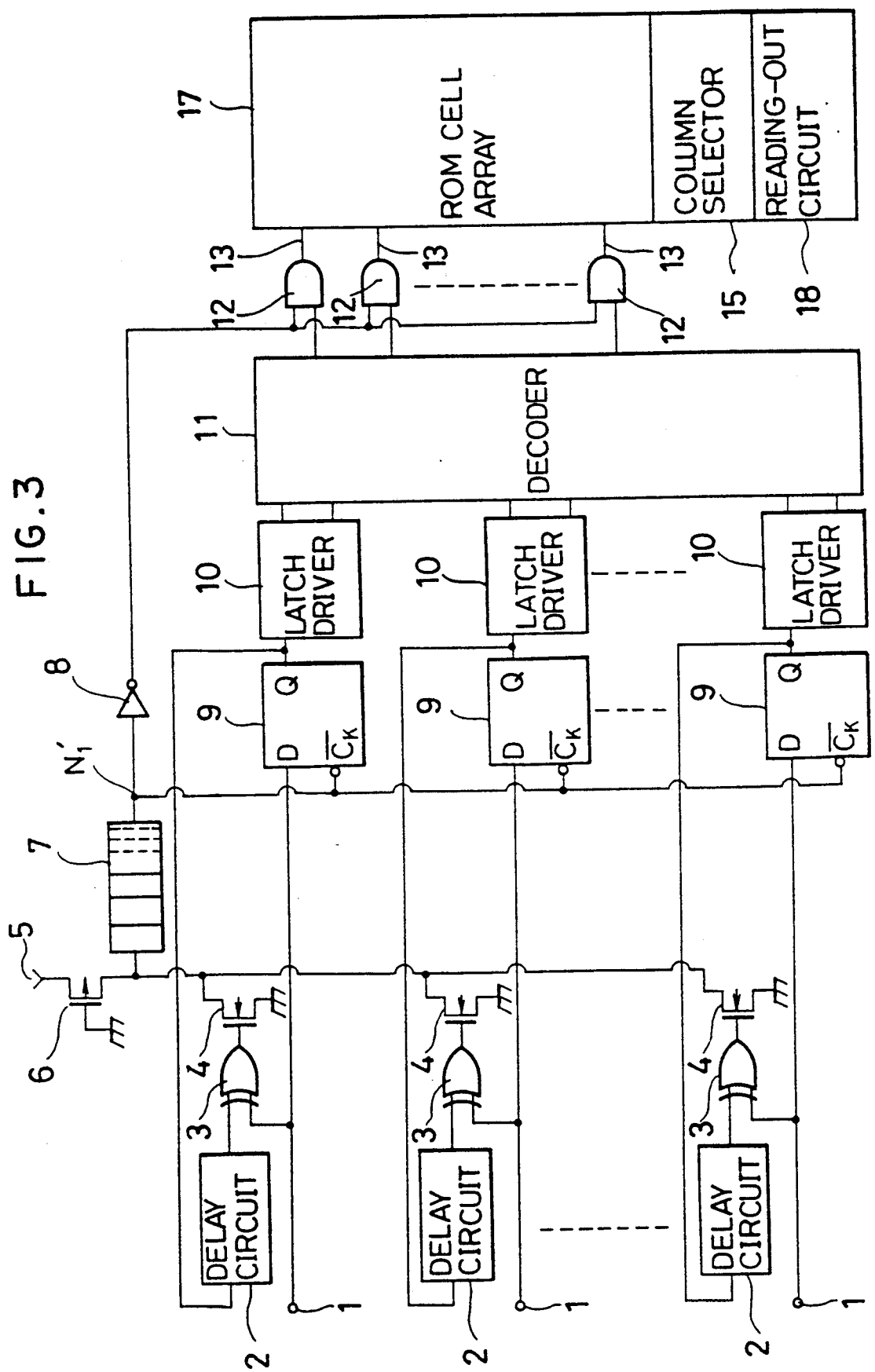
FIG. 3 is a circuit diagram showing a second embodiment of asynchronous semiconductor memory according to the present invention.

FIG. 3 is a circuit diagram of a second embodiment according to the present invention. In the figure, numeral 1 denotes an address input terminal or a reading-out control signal terminal.

In a delay circuit 2, a delay time interval is set to the reading-out time interval. Numeral 17 denotes ROM cell array. Numeral 18 denotes a reading-out circuit. When an internal clock is generated, data is read out from the ROM cell.

In this embodiment, the skew time interval is regulated for the ROM cell in a manner similar to the first embodiment.

As described above, according to the present invention, in the asynchronous semiconductor memory, a number of the delay circuit elements which are series-connected to each other and which have an input from the drain terminals of the plurality of the Nch-transistors and the Pch-transistor is suitably selected or set so as to adjust the skew time interval according to their delay amount. By such construction, it is not necessary to set operating timing of peripheral system in matching within the skew time interval of the asynchronous memory, thereby realizing advantage that the design time of asymmetric memory can be reduced to match with the timing of the system.

What is claimed is:

1. An asynchronous semiconductor memory comprising a memory cell array including a plurality of memory cells, means for receiving address signals, a detection circuit including a latch circuit, said detection circuit generating a detection signal when at least one of said address signals is changed;

a first transistor in said detecting circuit;

a second transistor opposite polarity of said first transistor having a source connected to a power source terminal;

an inverter; and a programmable delay circuit including delay circuit elements having delay amounts corresponding to desired clock widths, said delay circuit elements being series-connected to constitute a multi-stage delay circuit having an input terminal connected to a drain of said second transistor and connected to a drain of said first transistor and having an output terminal connected to said inverter and to said latch circuit of said detecting circuit, a delay time of said programmable delay circuit being programmed to one of a plurality of predetermined values, means for applying said detection signal to the input terminal of said multi-stage delay circuit to generate a delay signal at the output terminal thereof, a decoder responsive to said address signals for operatively selecting at least one of said memory cells, and control means responsive to said delay signal for enabling said decoder.

2. An asynchronous semiconductor memory comprising:

an address input terminal;

a plurality of address transition detecting circuits for receiving address signals from said address signal input terminal to generate address transition signals;

a plurality of first transistors having drains connected to one another, and each receiving a corresponding address transition signal at its gate;

a second transistor having a source connected to a power source terminal, said second transistor being of opposite polarity of the plurality of first transistors;

an invertor;

a programmable delay circuit including delay circuit elements having delay amounts corresponding to desired clock widths, said delay circuit elements being series-connected to constitute a multi-stage delay circuit, a drain of said second transistor and an input terminal of said multi-stage delay circuit being connected to a connecting terminal of a connecting line of drains of the plurality of first transistors, and an output terminal being connected to said invertor;

a plurality of latch circuits connected to an output terminal of said multi-stage delay circuit;

a plurality of latch drivers corresponding in number to the plurality of latch circuits and connected to output terminals thereof;

a decoder connected to said plurality of latch drivers;

a word line selecting section including an AND circuit, one input of which is connected to said decoder; and a memory cell array comprising a plurality of memory cells, which is connected to a word line.

3. The asynchronous semiconductor memory as set forth in claim 2, wherein said address input terminal is a reading-out/writing-in control signal terminal, and said memory cell array includes a RAM cell array, a column selector and a reading-out/writing-in circuit.

4. The asynchronous semiconductor memory as set forth in claim 2, wherein said address input terminal is a writing-in control signal terminal, and said memory cell array includes a ROM cell array, a column selector and a reading-out circuit.

* * * * *